(12) United States Patent
Dick

(10) Patent No.: US 8,417,749 B1
(45) Date of Patent: Apr. 9, 2013

(54) SPECIFYING A MULTIRATE DIGITAL FILTER BASED ON A RATIO OF AN INPUT SAMPLE RATE TO AN OUTPUT SAMPLE RATE

(75) Inventor: Christopher H. Dick, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 734 days.

(21) Appl. No.: 12/683,605

(22) Filed: Jan. 7, 2010

(51) Int. Cl.
*G06F 17/10* (2006.01)

(52) U.S. Cl.
USPC .......................................... 708/300; 708/313

(58) Field of Classification Search .................. None
See application file for complete search history.

(56) References Cited

U.S. PATENT DOCUMENTS

| | | | | |
|---|---|---|---|---|
| 7,321,913 B2 * | 1/2008 | McGrath | ...................... | 708/313 |
| 7,577,696 B2 * | 8/2009 | Bruekers et al. | .............. | 708/313 |
| 7,782,991 B2 * | 8/2010 | Sobchak et al. | .............. | 375/355 |
| 8,042,084 B1 * | 10/2011 | Janneck et al. | ............... | 716/117 |

OTHER PUBLICATIONS

P. P. Vaidyanathan, "Multirate Digital Filters, Filter Banks, Polyphase Networks, and Applications: A Tutorial", Proceedings of the IEEE, vol. 78, No. 1, Jan. 1990, p. 56-93.*
U.S. Appl. No. 12/488,171, filed Jun. 19, 2009, Janneck et al.

* cited by examiner

*Primary Examiner* — Tammara Peyton
(74) *Attorney, Agent, or Firm* — LeRoy D. Maunu

(57) ABSTRACT

Approaches for preparing a design of a digital multirate filter. In one approach, an objective function and an input and output characteristic are input for determining an effectiveness of a plurality of filters. The characteristic includes an overall rate change value that specifies a ratio of an input to an output sample rate. The overall rate change value is factored into a plurality of ordered sets, and the overall rate change value is a product of the factors in the ordered sets. Each of the filters corresponds to one of the ordered sets and includes a respective stage for each factor in the ordered set. One of the filters is selected based on respective values determined from evaluating an objective function for the filters, and the factor (s) in the ordered set that corresponds to the selected one of the filters is stored.

20 Claims, 7 Drawing Sheets

SPECIFYING A MULTIRATE DIGITAL FILTER BASED ON A RATIO OF AN INPUT SAMPLE RATE TO AN OUTPUT SAMPLE RATE

FIELD OF THE INVENTION

The present invention generally relates to digital signal processing, and more particularly to automatically generating digital multirate filters.

BACKGROUND

Digital filters transform a stream of input samples into a filtered stream of output samples. Digital multirate filters are digital filters with input sample rate differing from the output sample rate. Many wireless and wired communication protocols require digital multirate filters. It is time consuming and difficult to produce effective digital multirate filters.

The present invention may address one or more of the above issues.

SUMMARY

The embodiments of the present invention provide approaches for preparing a design of a digital multirate filter. In one embodiment, a method comprises inputting an objective function for determining an effectiveness of a plurality of digital multirate filters. An input and output characteristic of the digital multirate filters is also input. The characteristic includes an overall rate change value that specifies a ratio of integers equaling an input sample rate divided by an output sample rate. Each of the digital multirate filters has the input sample rate and the output sample rate. The overall rate change value is factored into a plurality of ordered sets of at least one factor. Each factor in each of the ordered sets is an integer or a reciprocal of an integer, and the overall rate change value is a product of the at least one factor in the ordered set. Each of the digital multirate filters corresponds to one of the ordered sets and includes a respective stage for each factor in the ordered set. The factor specifies a local rate change value of the respective stage. The method further includes evaluating a plurality of respective values of the objective function for the digital multirate filters. The respective value for each of the digital multirate filters indicates the effectiveness of the digital multirate filter. The method selects one of the digital multirate filters in response to the respective values of the objective function. The at least one factor in the ordered set that corresponds to the selected one of the digital multirate filters is stored.

In another embodiment, a program storage medium is provided with a processor-readable device configured with instructions for specifying a digital multirate filter. Execution of the instructions by one or more processors causes the one or more processors to perform operations including inputting an objective function for determining an effectiveness of a plurality of digital multirate filters and inputting an input and output characteristic of the digital multirate filters. The characteristic includes an overall rate change value that specifies a ratio of integers equaling an input sample rate divided by an output sample rate. Each of the digital multirate filters has the input sample rate and the output sample rate. The overall rate change value is factored into a plurality of ordered sets of at least one factor. Each factor in each of the ordered sets is an integer or a reciprocal of an integer, and the overall rate change value is a product of the at least one factor in the ordered set. Each of the digital multirate filters corresponds to one of the ordered sets and includes a respective stage for each factor in the ordered set, with the factor specifying a local rate change value of the respective stage. The operations further include evaluating a plurality of respective values of the objective function for the digital multirate filters. The respective value for each of the digital multirate filters indicates the effectiveness of the digital multirate filter. One of the digital multirate filters is selected in response to the respective values of the objective function. The at least one factor in the ordered set that corresponds to the selected one of the digital multirate filters is stored.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Digital multirate filters receive data at an input sample rate, filter the data, and output the filtered data at an output sample rate that differs from the input sample rate. For a decimation filter, the output sample rate is lower than the input sample rate, and the rate change between the input and output sample rates is an integer specifying the input sample rate divided by the output sample rate. For an interpolation filter, the output sample rate is higher than the input sample rate, and the rate change between the input and output sample rates is an integer specifying the output sample rate divided by the input sample rate. For digital multirate filters generally, the rate change between the input and output sample rates is a ratio of integers.

Figure 1:
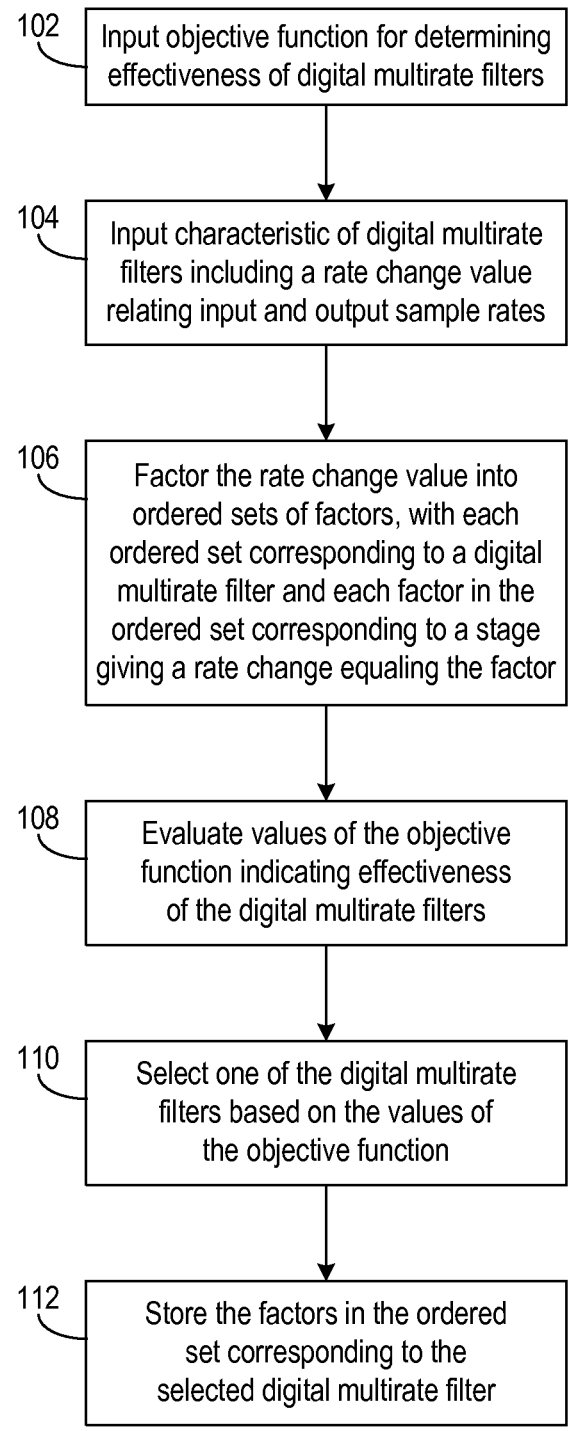
FIG. 1 is a flow diagram of a process for specifying a digital multirate filter in accordance with various embodiments of the invention.

FIG. 1 is a flow diagram of a process for specifying a digital multirate filter in accordance with various embodiments of the invention. An efficient implementation of a digital multirate filter decomposes the required overall rate change into a pipeline of simpler decimation and/or interpolation filters. The efficient implementation selects one of the many possible decompositions of the digital multirate filter.

At step 102, an objective function is input for evaluating the effectiveness of the possible digital multirate filters. In one embodiment, the objective function estimates or measures an implementation complexity of the digital multirate filters. For example, the objective function determines the circuitry area needed to implement each possible digital multirate filter in an integrated circuit.

At step 104, one or more characteristics of the digital multirate filter are input. The characteristics specify the rate change value relating the input and output sample rates. The characteristics often also specify the filtering performed by the digital multirate filter.

At step 106, the rate change is factored into various ordered sets of factors. For each ordered set, the rate change is a product of the factors in the ordered set, and each factor in the ordered set is an integer or the reciprocal of an integer. A digital multirate filter corresponds to each ordered set. The digital multirate filter for an ordered set includes a stage for each factor in the ordered set, with the stage providing a local rate change equaling the factor. Thus, the rate changed is factored into various ordered sets and each ordered set specifies the stages of a corresponding digital multirate filter.

At step 108, the digital multirate filters specified in step 106 are evaluated with the objective function input at step 102. The evaluated values of the objective function indicate the effectiveness of each of the digital multirate filters.

At step 110, one of the digital multirate filters is selected based on the evaluated values of the objective function. In one embodiment, the digital multirate filter having the best evaluated value is selected.

At step 112, the factors are stored from the ordered set corresponding to the selected digital multirate filter. The factors specify the local rate change of each stage of the selected digital multirate filter.

Figure 2:
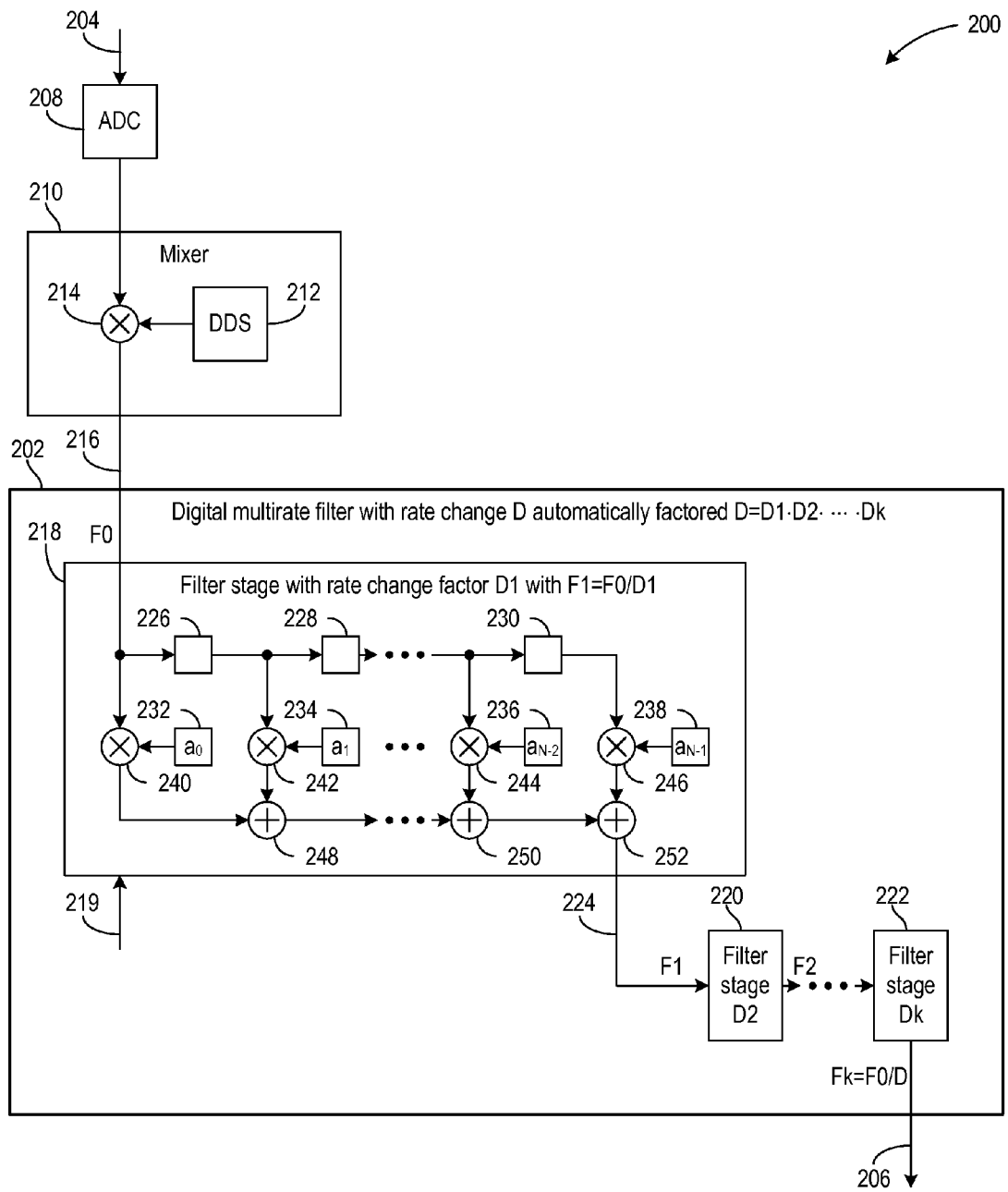
FIG. 2 is a block diagram illustrating an example digital multirate filter specified in accordance with various embodiments of the invention.

FIG. 2 is a block diagram illustrating an example digital multirate filter 202 specified in accordance with various embodiments of the invention. A down-converter 200 includes the digital multirate filter 202 to reduce the sample rate between the input signal on line 204 and the output signal on line 206, while also preventing frequency aliasing.

A wide-band analog to digital converter 208 samples the input signal on line 204 at the input sample rate. A mixer 210 translates the sampled input signal on line 204 to a baseband. The mixer 210 includes a digital frequency synthesizer 212 and a mixer 214 that multiplies the samples from converter 208 with respective samples from the digital frequency synthesizer 212. The mixer 210 translates each input frequency sampled from the input signal on line 204 to the sum and the difference between the input frequency and the frequency of the digital frequency synthesizer 212.

The digital multirate filter 202 eliminates the up-converted frequencies that are the sum of an input frequency sampled on line 204 and the frequency of the digital frequency synthesizer 212. Because the output signal on line 206 cannot accurately represent frequencies higher than half output sample rate, the digital multirate filter 202 also eliminates these frequencies to prevent frequency aliasing.

The digital multirate filter 202 reduces the input sample rate F0 on line 216 by a specified integer rate change, D. The rate change value is factored into an ordered set {D1, D2, ..., Dk} including k integer factors satisfying D=D1× D2× ... ×Dk. The factors D1, D2, through Dk in the ordered set correspond to respective stages 218, 220, through 222 in a pipeline for the digital multirate filter 202, and the order of the factors D1, D2, through Dk in the ordered set matches the order of the respective stages 218, 220 through 222 in the pipeline. Each stage implements a local rate equaling the factor corresponding to the stage. For example, stage 218 corresponds to factor D1, and stage 218 reduces the local input rate F0 on line 216 to the local output rate F1=F0/D1 on line 224.

Generally, the rate change value is factorable into many possible ordered sets including various numbers of factors, and the factors in each possible ordered set correspond to respective stages of additional digital multirate filters implementing the value of the rate change. For example, when factors D1, D2, through Dk have distinct values, a corresponding digital multirate filter exists for each permutation of these factors. There is a digital multirate filter implementing an integer rate change for all unique permutations of prime and non-prime factorings of an integer rate change. For a rate change value that is not an integer, but is instead a ratio of integers, there is a digital multirate filter implementing the rate change value for all unique permutations of factorings of the numerator of the ratio and factorings of the denominator of the ratio.

Stage 218 implements a decimation filter having a finite impulse response and a rate reduction value of D1. The filter operates at the sample rate F0 of the input signal on line 216, but the output signal on line 224 receives only every D1 calculated results to achieve the required rate reduction of stage 218. In one embodiment, stage 218 receives a clock signal on line 219 operating at the frequency of the input sample rate F0.

A chain of registers 226, 228, through 230 delays the samples from the input signal on line 216, and the output signal on line 224 is a weighted sum of these samples. The weights of the weighted sum are the filter coefficients 232, 234, through 236, and 238. Multiplier 240 multiplies the current input sample from the input signal on line 216 with the first filter coefficient 232. Multipliers 242 through 244 and 246 multiply increasingly delayed input samples with corresponding filter coefficients 234 through 236 and 238. Adders 248, 250, and 252 add the weighted samples from multipliers 240, 242 through 244, and 246. In one embodiment, multiplier 242 and adder 248 form a multiply-accumulate element, multiplier 244 and 250 form a multiply-accumulate element, and multiplier 246 and 252 form a multiply-accumulate element. The required transfer function for the filter stage 218 determines the needed number of filter coefficients 232, 234 through 236, and 238 and their values.

Stages 220 through 222 similarly implement rate reductions D2 through Dk with filter coefficients given by the required transfer functions for the stages. The multirate filter 202 is the composition of filter stages 218, 220, through 222. Splitting the multirate filter 202 into stages 218, 220, through 222 produces an efficient implementation that achieves the required rate reduction and the required overall transfer function for the multirate filter 202.

It will be appreciated that interpolation filters are similarly implemented in various other embodiments of the invention. The required transfer function for an interpolation filter ensures that no image bands contaminate the shaped, up-sampled, and carrier centered signal. In addition, digital multirate filters with a rate change value that is a ratio of integers are similarly implemented with features of both decimation and interpolation filters.

Figure 3A:
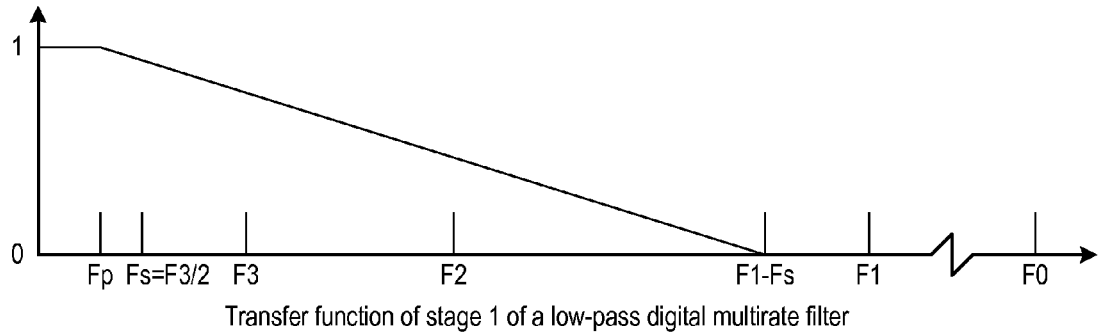
FIGS. 3A, 3B, and 3C are graphs of the transfer function of the stages of an example digital multirate filter specified in accordance with various embodiments of the invention.
Figure 3B:
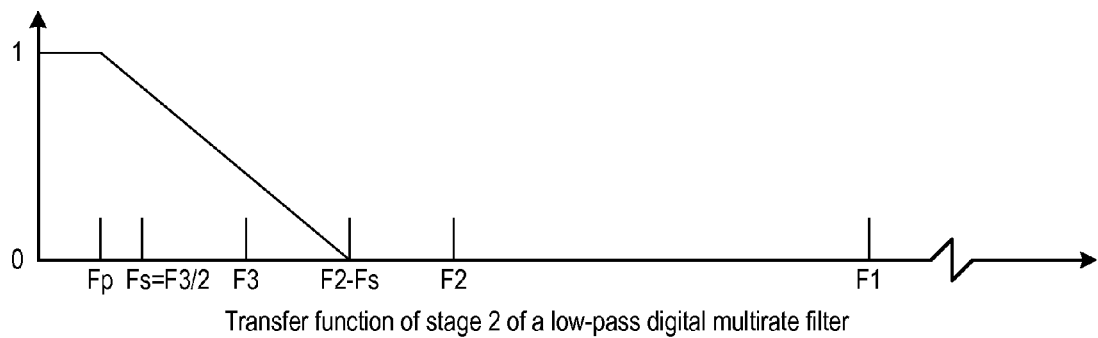
Figure 3C:
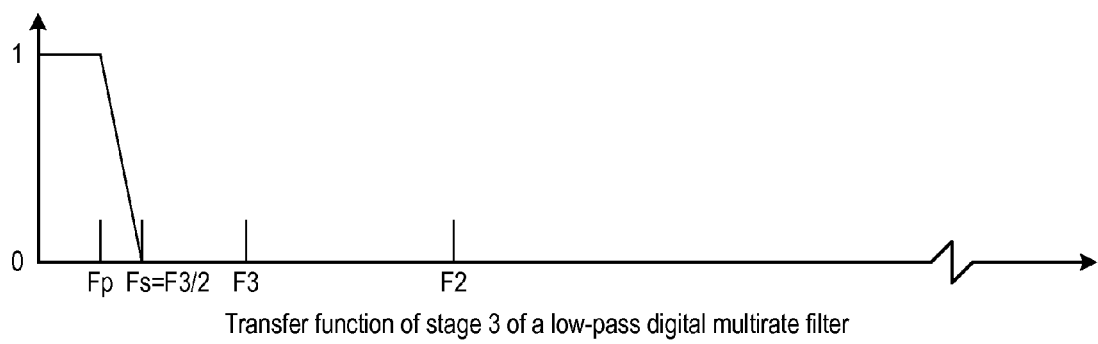

FIGS. 3A, 3B, and 3C are graphs of the transfer function of the stages of an example digital multirate filter specified in accordance with various embodiments of the invention. The digital multirate filter has three stages, and in one embodiment, FIGS. 3A, 3B, and 3C respectively correspond to the transfer functions of stages 218, 220, and 222 of the multirate filter 202 of FIG. 2. FIGS. 3A, 3B, and 3C illustrate idealized transfer functions; the actually implemented transfer functions depend on additional filter characteristics, such as the permissible amount deviation from these idealized transfer functions. The overall transfer function of the digital multirate filter is the product of the three transfer functions shown in FIGS. 3A, 3B, and 3C.

The example digital multirate filter has a specified input sample rate of F0 and a specified output sample rate of F3. Because the output signal cannot correctly represent frequencies higher than half the output sample rate, the digital multirate filter has a stopband limit frequency Fs=F3/2. The digital multirate filter ideally does not output any frequencies above the stopband limit frequency because the last stage ideally does not output any frequencies above the stopband limit frequency as shown in FIG. 3C. The digital multirate filter is a low-pass filter passing frequencies in the passband below passband limit frequency Fp, and attenuating frequencies in the stopband above passband limit frequency Fp. A user specifies the passband limit frequency Fp in one embodiment.

One possible factoring of the rate reduction value D=F0/F3 generates the three-stage multirate filter with intermediate sample rates F1 and F2 in this example. In FIG. 3A, the first stage has nominal unity gain in the passband below the passband limit frequency Fp and gain declining in the stopband from unity gain at the passband limit frequency Fp to zero gain at F1−Fs, which is the output sample rate F1 of the first stage minus the stopband limit frequency Fs. While the gain could decline faster than shown in the stopband, the number of filter coefficients required for the first stage is reduced when the gain nominally does not decline faster than shown. The actual number of filter coefficients and their values are given by the idealized transfer function shown in FIG. 3A, and the permissible ripple in the passband and stopband. In one embodiment, a user specifies the passband and stopband ripple, and the actual number of filter coefficients determines the number of multiply-accumulate elements required in the first stage.

In FIG. 3B, the second stage has nominal unity gain in the passband below the passband limit frequency Fp and gain declining in the stopband from unity gain at the passband limit frequency Fp to zero gain at F2−Fs, which is the output sample rate F2 of the second stage minus the stopband limit frequency Fs. In FIG. 3C, the third stage has nominal unity gain in the passband below the passband limit frequency Fp and gain declining in the stopband from unity gain at the passband limit frequency Fp to zero gain at F3−Fs=Fs=F3/2, which is the stopband limit frequency.

Figures 4, 5:
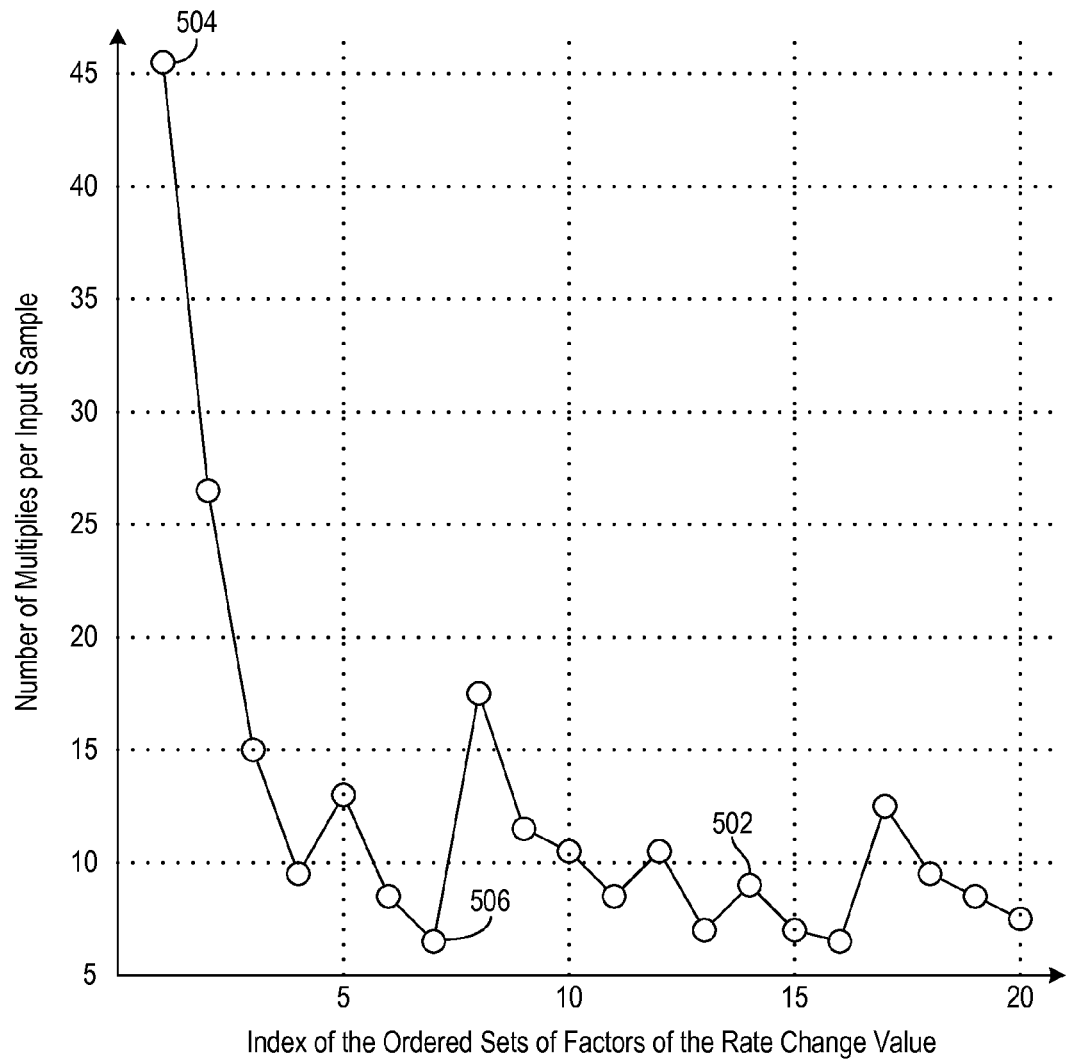
FIG. 4 is table of sets of factors of a rate change value of an example digital multirate filter specified in accordance with various embodiments of the invention.
FIG. 5 is a graph illustrating evaluation of digital multirate filters for the sets of factors of FIG. 3.

FIG. 4 is table 400 of sets of factors of a rate change value of an example digital multirate filter specified in accordance with various embodiments of the invention. The rate value change in this example is forty, which has the prime factors {2, 2, 2, 5}.

Because the rate change value has four prime factors, the possible factorings include four or fewer factors. Column 402 lists the four sets that include four factors, and these sets are the unique permutations of the prime factors. Column 404 lists the nine sets that include three factors, and these sets are the unique permutations of two of the prime factors and the product of the remaining two factors. Column 406 lists the six sets that include two factors, and column 408 lists the one set that includes one factor.

The twenty sets of factors are assigned the index shown in columns 410. Each set corresponds to a different possible implementation of a digital multirate filter having a rate change value of forty. Thus, there are twenty possible implementations of the example digital multirate filter. Each set is an ordered set, with each factor in a particular ordered set listed in the order that corresponding stages appear in a pipeline implementing the digital multirate filter for the particular ordered set, and each factor specifying the local rate change provided by the corresponding stage. For example, the ordered set with index fourteen of row 412 has a first stage providing a rate change of five to the filter input, a second stage providing a rate change of two to the output of the first stage, and a final stage providing the filter output from a rate change of four to the output of the second stage.

FIG. 5 is a graph illustrating evaluation of digital multirate filters for the sets of factors of FIG. 3. The graph includes twenty points corresponding to the twenty ordered sets of factors in FIG. 4. The horizontal axis in FIG. 5 shows the values of the index shown in column 410 of FIG. 4. Thus, point 502 at index fourteen corresponds to the ordered set of row 412 in FIG. 4.

The graph shows the computational workload for implementing the twenty digital multirate filters for the twenty ordered sets of factors. The vertical axis in FIG. 5 shows the computational workload of the number of multiplies required per input sample for each digital multirate filter. The computational workload varies widely between about forty-six multiplies per input sample at point 504 for a one-stage digital multirate filter, to about six multiplies per input sample at point 506 with index seven. The minimum computational workload at point 506 with index seven corresponds to row 414 in FIG. 4 for the ordered set {20, 2}. Thus, the digital multirate filter providing the minimum computational workload has a first stage providing a rate change of twenty and a second stage providing a rate change of two.

Figure 6:
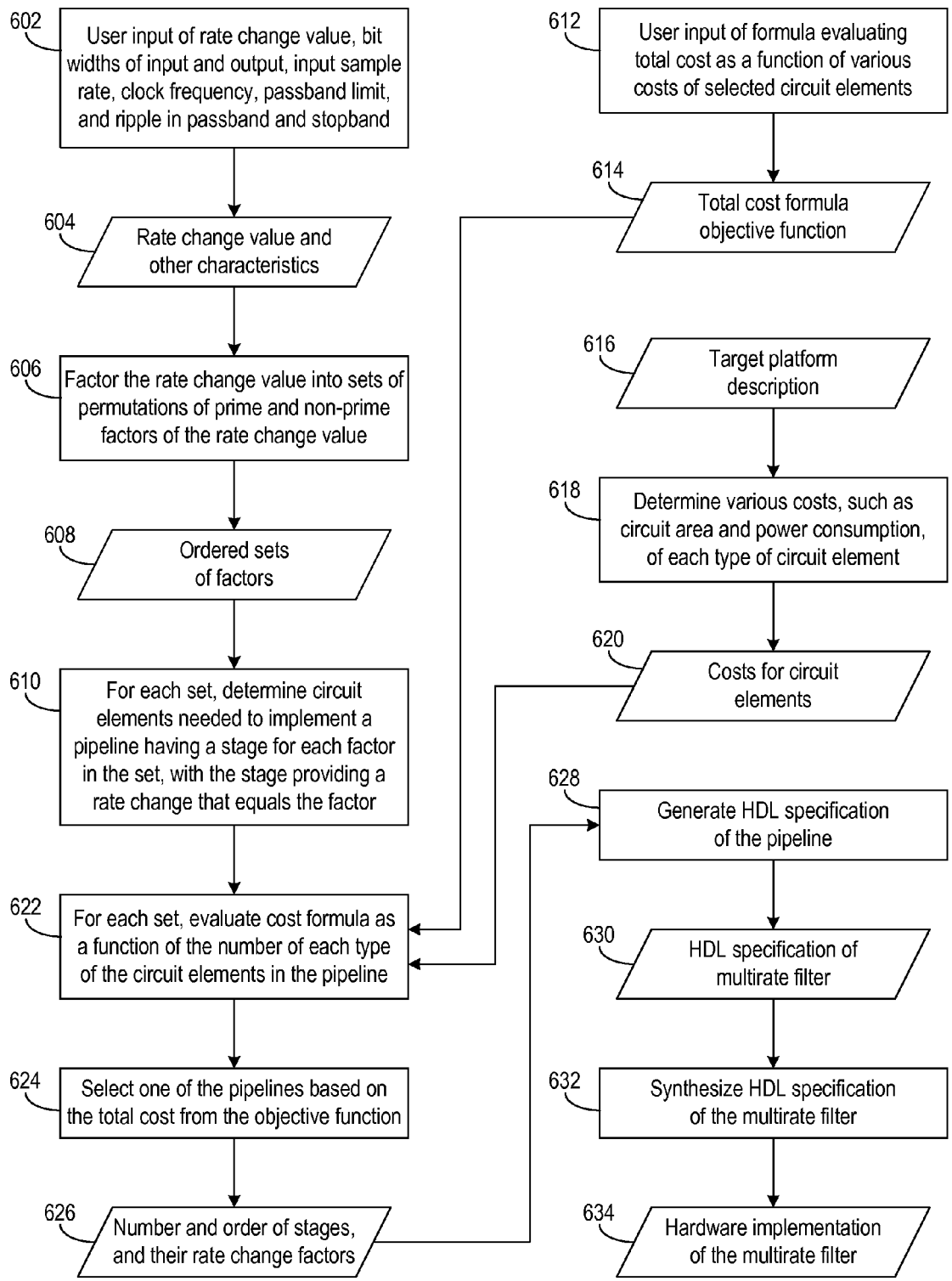
FIG. 6 is a data flow diagram of a process for specifying a digital multirate filter in accordance with various embodiments of the invention.

FIG. 6 is a data flow diagram of a process for specifying a digital multirate filter in accordance with various embodiments of the invention. Based on user supplied characteristics of the digital multirate filter, many possible implementations are evaluated and one implementation is selected.

At step 602, a user inputs the characteristics 604 for the digital multirate filter. These characteristics 604 include a rate change value, bit widths of the input and output signals of the digital multirate filter, an input sample rate, an operating clock frequency, a passband limit frequency, and permitted ripple in the passband and stopband.

At step 606, the rate change value is factored into ordered sets 608 of permutations of prime and non-prime factors of the rate change value. In one embodiment, the rate change value is an integer specifying the rate change for a decimation or interpolation filter, and the ordered sets 608 are factorings of the rate change value into all unique permutations of its prime and non-prime integer factors.

At step 610, the needed circuit elements are determined for implementing a digital multirate filter for each of the ordered sets 608. The digital multirate filter for a particular ordered set is a pipeline including a stage for each factor in the ordered set, with the stage providing a rate change that equals the factor. The circuit elements are those needed to implement each digital multirate filter having the performance characteristics 604.

To evaluate each digital multirate filter, a user inputs at step 612 a formula 614 for evaluating a total cost of each digital multirate filter as a function a various costs of the circuit elements. In one example, the costs of the circuit elements include circuitry area and power consumption for each of the circuit elements, and the user selects the weights for a weighted sum of each of the costs of each of the circuit elements. In another example, the user selects a non-linear formula, such as the product of a weighted sum of the circuitry area of each of the circuit elements and another weighted sum of power consumption of each of the circuit elements. Generally, the user specifies any formula of the various costs of the circuit elements.

To evaluate each digital multirate filter, the user specifies the evaluation formula 614 of various costs of the circuit elements, and the various costs are determined from the target platform description 616 at step 618. In one embodiment, the target platform description 616 specifies the semiconductor layout of gates, registers, multipliers, adders and other circuit elements; and the costs 620 of the circuitry area and the operating power consumption are extracted from the semiconductor layouts of these circuit elements. In another embodiment, the costs 620 are circuitry area and power consumption of various implementations of the circuit element in a programmable integrated circuit. For example, a programmable integrated circuit includes dedicated hardware multipliers and programmable logic and interconnect resources, and the costs 620 include the circuitry area and power consumption for implementing multiplier circuit elements in either the dedicated hardware multipliers or the programmable logic and interconnect resources. Multiple implementation costs for a particular circuit element proves advantageous with a non-linear objective function 614 that evaluates whether each digital multirate filter can be implemented in a particular programmable integrated circuit having a limited number of dedicated hardware multipliers and a limited number of programmable logic and interconnect resources.

At step 622, the digital multirate filter corresponding to each ordered set 608 is evaluated using the total cost formula 614 and the costs 620 of the circuit elements required to implement the digital multirate filter. At step 624, one of the digital multirate filters is selected based on evaluated total cost from step 622. In one embodiment, the selected multirate filter 626 has the minimum cost. The selected multirate filter 626 specifies the number of stages and their local rate change factors.

At step 628, a specification 630 of the pipeline for the selected multirate filter 626 is generated in a hardware description language. At step 632, the HDL specification 630 is synthesized into a hardware implementation 634 of the selected digital multirate filter.

Figure 7:
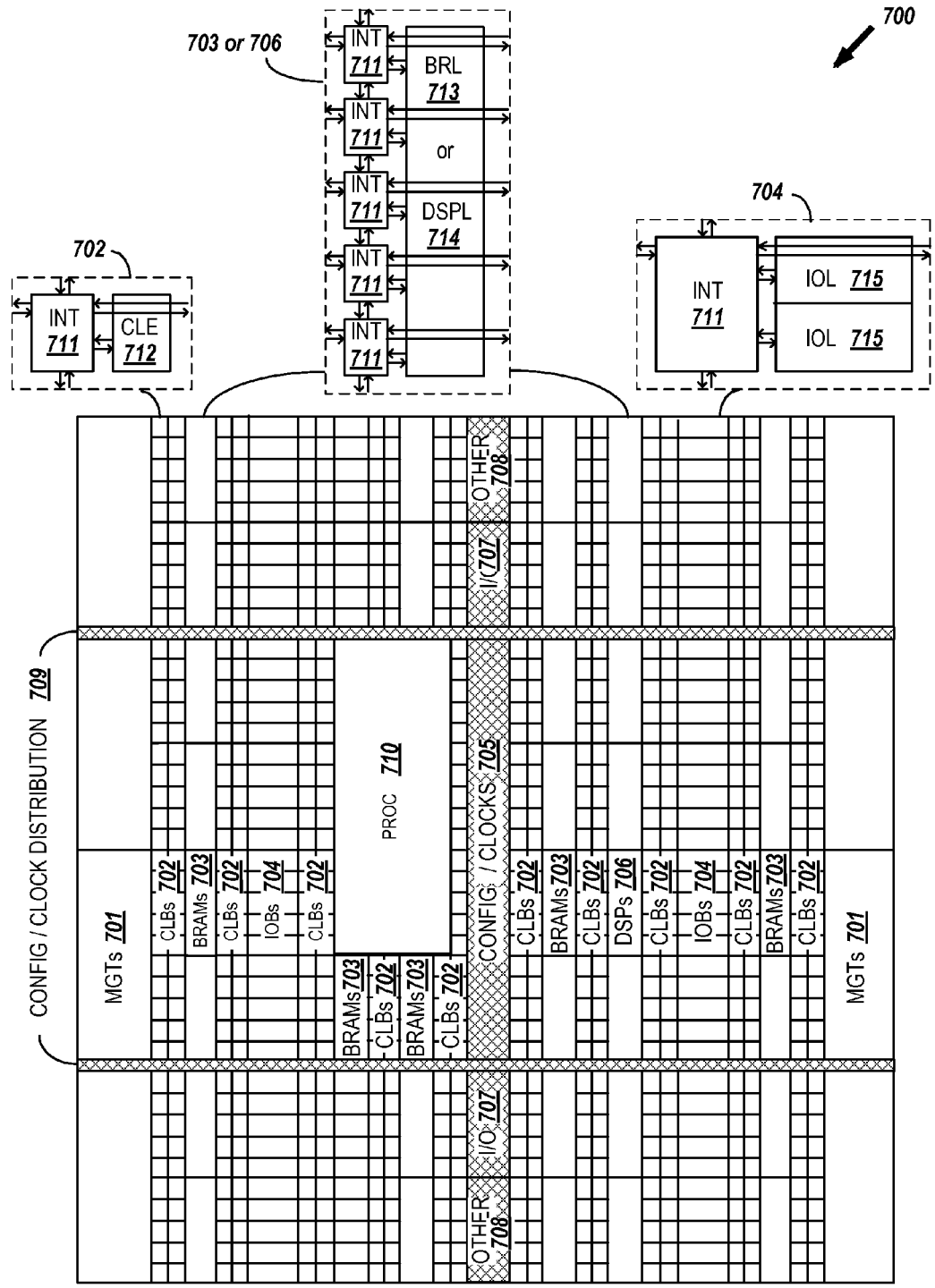
FIG. 7 is a block diagram of a programmable integrated circuit for implementing a digital multirate filter in accordance with various embodiments of the invention.

FIG. 7 is a block diagram of a programmable integrated circuit for implementing a digital multirate filter in accordance with various embodiments of the invention. Programmable logic and interconnect resources of the programmable integrated circuit implement the digital multirate filter.

Advanced FPGAs are programmable integrated circuits that can include several different types of programmable logic blocks in the array. For example, FIG. 7 illustrates an FPGA architecture 700 that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

Figure 8:
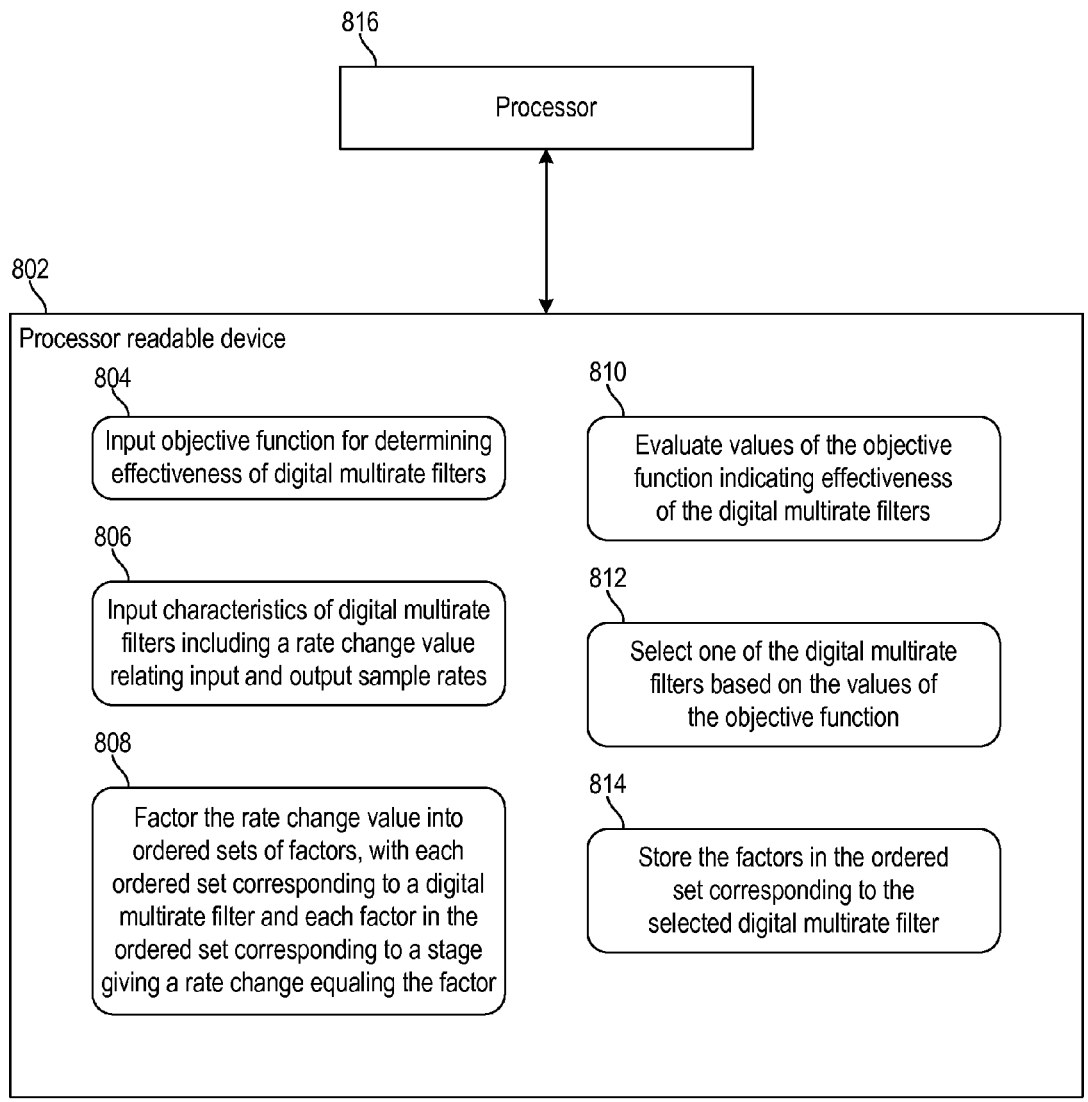
FIG. 8 is a block diagram of a system for specifying a digital multirate filter in accordance with various embodiments of the invention.

FIG. 8 is a block diagram of a system for specifying a digital multirate filter in accordance with various embodiments of the invention. The system includes a processor-readable device 802 configured with software modules 804, 806, 808, 810, 812, and 814 for specifying a digital multirate filter.

Execution of the instructions in software module 804 causes processor 816 to input an objective function for determining an effectiveness of each digital multirate filter. Execution of the instructions in software module 806 causes processor 816 to input an input and output characteristic of the digital multirate filters. The characteristic includes an overall rate change value that specifies a ratio of integers equaling an input sample rate divided by an output sample rate for the digital multirate filters.

Execution of the instructions in software module 808 causes processor 816 to factor the overall rate change value into ordered sets of factors. Each factor in each ordered set is an integer or a reciprocal of an integer. The overall rate change value is a product of the factors in each ordered set. Each digital multirate filter corresponds to an ordered set and includes a respective stage for each factor in the ordered set, and the factor specifies a local rate change value of the respective stage.

Execution of the instructions in software module 810 causes processor 816 to evaluate values of the objective function for the digital multirate filters. The values indicate the effectiveness of the digital multirate filters. Execution of the instructions in software module 812 causes processor 816 to select one of the digital multirate filters based on the values of the objective function. Execution of the instructions in software module 814 causes processor 816 to store the factors in the ordered set that corresponds to the selected digital multirate filter.

The present invention is thought to be applicable to a variety of systems for creating designs of multirate filters. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for specifying a digital multirate filter, comprising:
    inputting an objective function for determining an effectiveness of a plurality of digital multirate filters;
    inputting an input and output characteristic of the digital multirate filters;
    wherein the characteristic includes an overall rate change value that specifies a ratio of integers equaling an input sample rate divided by an output sample rate, each of the digital multirate filters having the input sample rate and the output sample rate;
    factoring the overall rate change value into a plurality of ordered sets of at least one factor, with each factor in each of the ordered sets being an integer or a reciprocal of an integer, and the overall rate change value being a product of the at least one factor in the ordered set;
    wherein each of the digital multirate filters corresponds to one of the ordered sets and includes a respective stage for each factor in the ordered set, with the factor specifying a local rate change value of the respective stage;
    evaluating a plurality of respective values of the objective function for the digital multirate filters, the respective value for each of the digital multirate filters indicating the effectiveness of the digital multirate filter;
    selecting a one of the digital multirate filters in response to the respective values of the objective function; and
    storing the at least one factor in the ordered set that corresponds to the selected one of the digital multirate filters.

2. The processor-implemented method of claim 1, wherein:
    the inputting of the objective function includes inputting the objective function that counts a number of multiply-accumulate elements in the digital multirate filters;
    the evaluating includes counting the respective value of the number of multiply-accumulate elements in each of the digital multirate filters; and
    the selecting includes selecting the one of the digital multirate filters that has the effectiveness of a minimum for the number of multiply-accumulate elements.

3. The processor-implemented method of claim 1, wherein:
    the inputting of the objective function includes inputting the objective function that determines a circuit area used in the digital multirate filters;
    the evaluating includes determining the respective value of the circuit area used in each of the digital multirate filters; and
    the selecting includes selecting the one of the digital multirate filters that has the effectiveness of a minimum for the circuit area used.

4. The processor-implemented method of claim 1, wherein:
    the inputting of the objective function includes inputting the objective function that estimates a power consumption of the digital multirate filters;
    the evaluating includes estimating the respective value of the power consumption of each of the digital multirate filters; and
    the selecting includes selecting the one of the digital multirate filters that has the effectiveness of a minimum for the power consumption.

5. The processor-implemented method of claim 1, wherein:
    the inputting of the objective function includes determining a plurality of types of costs of a plurality of circuit elements for implementing the digital multirate filters, with the objective function specified as a formula of at least one of the costs in response to user input; and
    the evaluating of the respective values of the objective function for the digital multirate filters includes evaluating the formula in response to the circuit elements required for implementing each of the digital multirate filters.

6. The processor-implemented method of claim 1, wherein:
    the inputting of the characteristic includes inputting the overall rate change value that is an integer for the ratio;
    the ratio is not unity; and
    the ratio equals the input sample rate divided by the output sample rate for the digital multirate filters that are decimation filters.

7. The processor-implemented method of claim 1, wherein:
    the inputting of the characteristic includes inputting the overall rate change value that is an integer for a reciprocal of the ratio;
    the ratio is not unity; and
    the ratio equals the input sample rate divided by the output sample rate for the digital multirate filters that are interpolation filters.

8. The processor-implemented method of claim 1, wherein:
    the inputting of the characteristic includes inputting the characteristic that further includes an input bit width and an output bit width;
    the digital multirate filters input data having the input bit width at the input sample rate; and
    the digital multirate filters outputting data having the output bit width at the output sample rate.

9. The processor-implemented method of claim 1, wherein:
    the inputting of the characteristic includes inputting the characteristic that further includes the input sample rate, a limit frequency for a passband of a transfer function of the digital multirate filters, a frequency of an operating clock signal for the digital multirate filters, a permissible amount of ripple in the passband of the transfer function of the digital multirate filters, and a permissible amount of ripple in a stopband of the transfer function of the digital multirate filters.

10. The processor-implemented method of claim 1, wherein:

the factoring of the overall rate change value includes factoring the overall rate change value that is an integer into a respective one of the ordered sets for each one of all permutations of prime and non-prime integer divisors of the overall rate change value; and the respective ordered set includes the at least one factor of the permutation of the integer divisors of the overall rate change value.

11. The processor-implemented method of claim 1, wherein:

the digital multirate filter corresponding to each of the ordered sets includes a pipeline having the respective stage for each factor in the ordered set;

for each first and successive second factor in the ordered set, the respective stage for the second factor succeeds the respective stage for the first factor in the pipeline; and an input port of the respective stage for the second factor is coupled to an output port of the respective stage for the first factor.

12. The processor-implemented method of claim 1, wherein:

the evaluating of the respective value of the objective function for each digital multirate filter includes, for the respective stage for each factor in the ordered set that corresponds to the digital multirate filter, determining a transfer function of the respective stage and determining a number of multiply-accumulate elements needed to implement the transfer function and achieve the input and output characteristic.

13. The processor-implemented method of claim 12, wherein:

the inputting of the input and output characteristic includes inputting, for the digital multirate filters, the input sample rate, a limit frequency for a passband, a frequency of an operating clock signal, a permissible amount of ripple in the passband, and a permissible amount of ripple in a stopband.

14. The processor-implemented method of claim 13, wherein:

the determining of the transfer function of the respective stage for each factor in the ordered set that corresponds to each digital filter includes determining the transfer function in response to the input sample rate and the limit frequency for the passband; and the determining of the number of multiply-accumulate elements includes determining the number of multiply-accumulate elements in response to the transfer function, the frequency of the operating clock signal, the permissible amount of ripple in the passband, and the permissible amount of ripple in the stopband.

15. The processor-implemented method of claim 14, wherein the evaluating of the respective value of the objective function for each digital multirate filter includes counting the multiply-accumulate elements in the digital multirate filter.

16. The processor-implemented method of claim 1, wherein the selecting of the one of the digital multirate filters includes selecting one of the digital multirate filters having a minimum of the respective values of the objective function.

17. The processor-implemented method of claim 1, wherein:

the storing includes storing a specification of a pipeline of a plurality of the respective stages of the selected digital multirate filter;

the pipeline includes the respective stages in a sequence corresponding to an order of the at least one factor in the ordered set corresponding to the selected digital multirate filter; and the specification specifies a number of the respective stages and the factor for each of the respective stages in the sequence.

18. The processor-implemented method of claim 17, wherein:

the storing of the specification of the pipeline includes storing the specification of the pipeline in a hardware description language and synthesizing an implementation of the pipeline of the selected digital multirate filter from the specification in the hardware description language.

19. The processor-implemented method of claim 18, wherein the implementation of the selected digital multirate filter is implemented in programmable logic and interconnect resources of a programmable integrated circuit.

20. A program storage medium, comprising:

a processor-readable device configured with instructions for specifying a digital multirate filter, wherein execution of the instructions by one or more processors causes the one or more processors to perform operations including:

inputting an objective function for determining an effectiveness of a plurality of digital multirate filters;

inputting an input and output characteristic of the digital multirate filters;

wherein the characteristic includes an overall rate change value that specifies a ratio of integers equaling an input sample rate divided by an output sample rate, each of the digital multirate filters having the input sample rate and the output sample rate;

factoring the overall rate change value into a plurality of ordered sets of at least one factor, with each factor in each of the ordered sets being an integer or a reciprocal of an integer, and the overall rate change value being a product of the at least one factor in the ordered set;

wherein each of the digital multirate filters corresponds to one of the ordered sets and includes a respective stage for each factor in the ordered set, with the factor specifying a local rate change value of the respective stage;

evaluating a plurality of respective values of the objective function for the digital multirate filters, the respective value for each of the digital multirate filters indicating the effectiveness of the digital multirate filter;

selecting a one of the digital multirate filters in response to the respective values of the objective function; and storing the at least one factor in the ordered set that corresponds to the selected one of the digital multirate filters.

* * * * *